United States Patent [19]

Ugenti

[11] Patent Number: 4,745,365

[45] Date of Patent: May 17, 1988

[54] DIGITAL RECEIVER WITH DUAL REFERENCES

[75] Inventor: Michael Ugenti, Melville, N.Y.

[73] Assignee: Grumman Aerospace Corporation, Bethpage, N.Y.

[21] Appl. No.: 948,260

[22] Filed: Dec. 31, 1986

[51] Int. Cl.[4] .................. H03K 5/153; H03K 5/24
[52] U.S. Cl. .................. 328/147; 307/360; 307/362
[58] Field of Search ............. 307/360, 362; 328/147

[56] References Cited

U.S. PATENT DOCUMENTS

| | | |
|---|---|---|
| 3,466,552 | 9/1969 | Sels . |
| 3,508,075 | 4/1970 | Savage . |
| 3,600,606 | 8/1971 | Clor, Jr. . |
| 3,860,877 | 1/1975 | Games, et al. . |
| 3,866,130 | 2/1975 | Krause . |
| 3,947,699 | 3/1976 | Whitmer ........................ 307/360 |
| 3,965,428 | 6/1976 | Katz et al. . |
| 4,157,509 | 6/1979 | Zielinski . |
| 4,162,454 | 7/1979 | Olsen . |
| 4,217,506 | 8/1980 | Sawyer, Jr. et al. . |
| 4,245,192 | 1/1981 | Whiffen . |
| 4,342,965 | 8/1982 | Baldwin ........................ 307/360 |
| 4,507,578 | 3/1985 | Matsuda . |

OTHER PUBLICATIONS

Maddox, "Logic Probe", Western Electric Technical Digest No. 40, Oct. 1975, pp. 13–15.

Primary Examiner—John Zazworsky
Attorney, Agent, or Firm—Pollock, VandeSande & Priddy

[57] ABSTRACT

A pair of comparators is provided with attenuated input signals. Each comparator is provided with a different reference level so that two sets of complementary digital outputs may be obtained with different pulse widths. Hysteresis control is provided to the comparators to compensate for noise present at the comparator inputs.

9 Claims, 2 Drawing Sheets

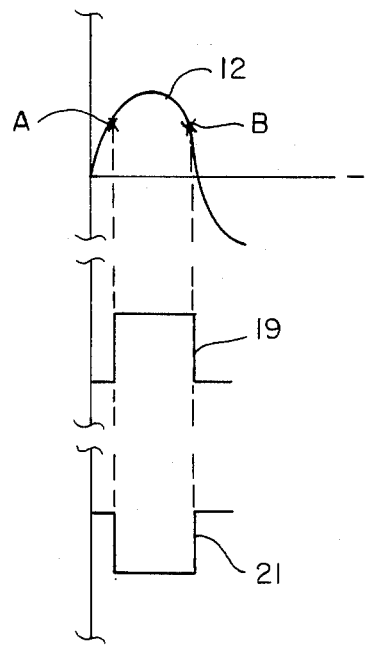
FIG. 2A
FIG. 2B
FIG. 2C
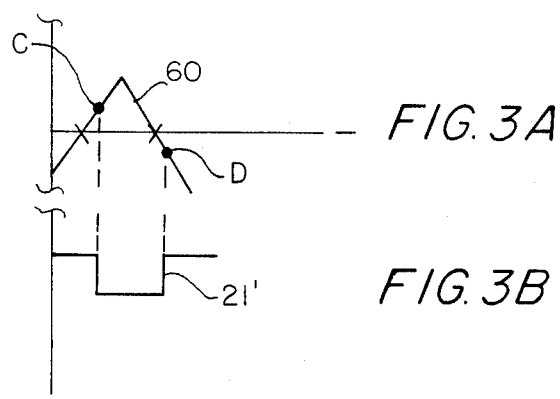
FIG. 3A
FIG. 3B

DIGITAL RECEIVER WITH DUAL REFERENCES

FIELD OF THE INVENTION

The present invention relates to a digital receiver, and more particularly to such a receiver incorporating analog comparators capable of switching an input signal at multiple reference levels.

BACKGROUND OF THE INVENTION

In a number of digital receiver applications, a need exists for comparing incoming analog and digital signals with preselected reference levels and generating an output digital signal dependent thereon.

Although comparator circuits are well known in the art, they are traditionally used in conjunction with single reference levels. It would be quite advantageous for a digital receiver to be capable of high frequency operation with high and low reference levels, where the input signal has a noise content. Further, it would be most desirable to maximize the design of such a circuit so that it could be incorporated in a hybrid single in-line package.

BRIEF DESCRIPTION OF THE PRESENT INVENTION

The present invention incorporates two high-speed analog comparators capable of switching at preselected reference levels at high speed. In the preferred embodiment high and low reference inputs are provided to respective comparators so that the input signal can furnish two digital output signals having different pulse widths.

Hysteresis control is provided for each of the comparators so that switching action by the comparators occurs when normal noise components are present in the input signal. In a prototype design, the present invention exhibited switching within 50 mv of the reference signals (for high speed) and 100 mv (for low speed) at operating frequencies of 50 MHz.

The above-mentioned objects and advantages of the present invention will be more clearly understood when considered in conjunction with the accompanying drawings, in which:

BRIEF DESCRIPTION OF THE FIGURES

FIG. 2A is a plot of an input signal to the circuitry of FIG. 1;
FIG. 2B is a plot of a first output signal from the circuitry of FIG. 1;
FIG. 2C is a plot of a complementary output from the circuitry of FIG. 1;
FIG. 3A is a plot of a triangular input signal to the circuitry of FIG. 1 and is subjected to a hysteresis control signal from the circuitry of FIG. 1;
FIG. 3B is a plot of a digital output signal from the circuitry of FIG. 1 as a result of hysteresis control.

DETAILED DESCRIPTION OF THE INVENTION

Figure 1:
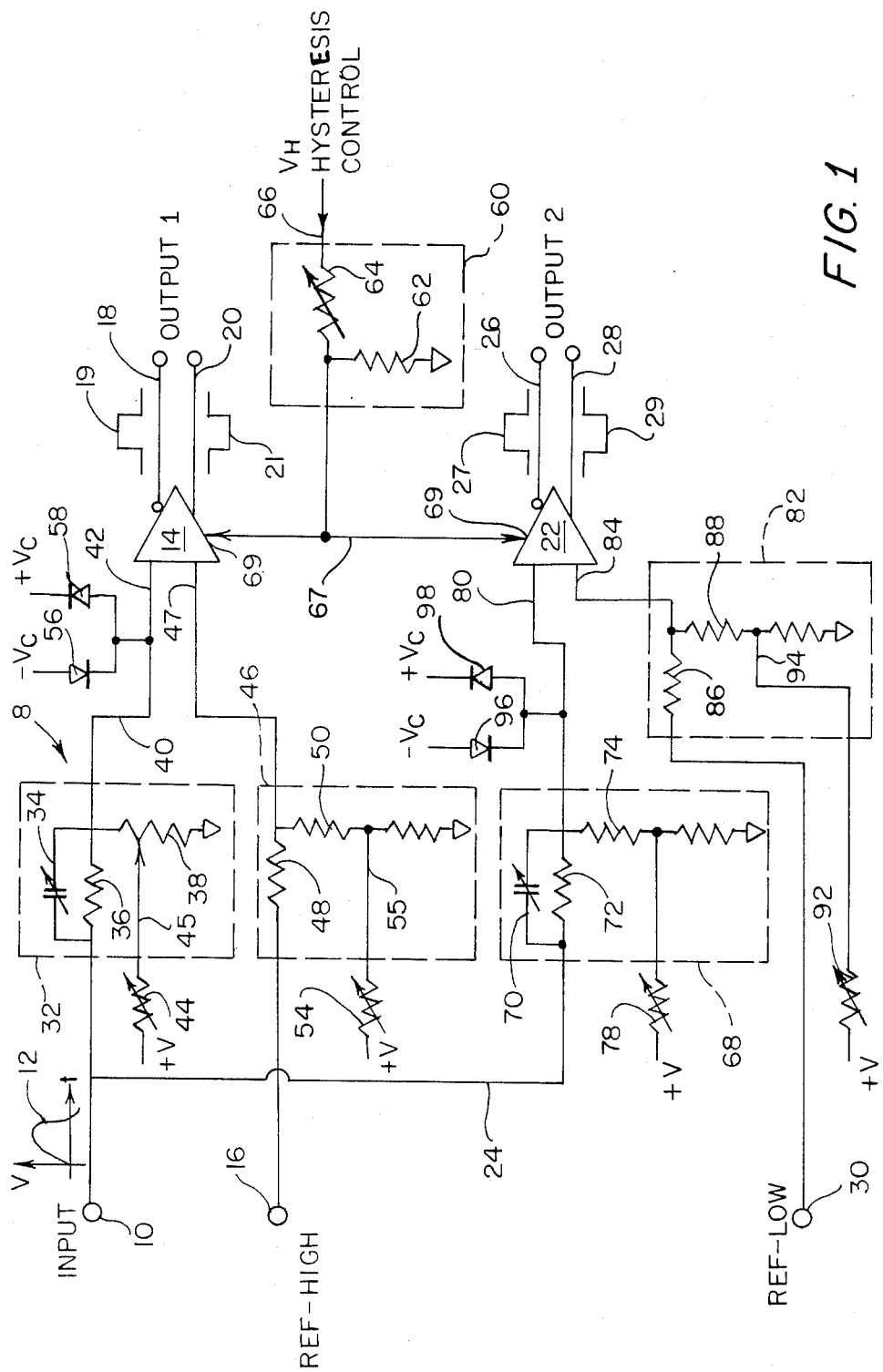
FIG. 1 is a circuit diagram of the present invention.

Referring to the figures and more particularly FIG. 1, an input signal is provided at terminal 10 of the digital receiver 8 of the present invention. Typically, a sinusoidal signal, such as indicated at 12, is provided, although other waveforms may be accommodated. The input signal at terminal 10 is compared in comparator 14 with a first reference signal appearing at terminal 16. Each time the input signal 12 passes through the reference level, the comparator 14 is switched, thereby creating a pulse output signal such as shown at 19 on the output line 18 of comparator 14. This switching action is more clearly shown in FIGS. 2A and 2B. The width of pulse 19 is determined by the comparator switch points A and B. Comparator 14 is provided with a positive output line 18 and a complementary or inverted line 20, which generate the same output signal but inverted, as shown by reference numeral 21 at the output line 20 and shown in further detail in FIG. 2C. Thus, output 1 at the output of comparator 14 provides positive- and negative-going converted output signals.

Simultaneous with the generation of signals at output 1, the input signal at terminal 10 may be provided to a second comparator 22, via line 24, so that pulse output signals 27, 29 of different pulse width may be simultaneously generated at output lines 26 and 28 of comparator 22 (output 2) as compared to output 1. This necessitates providing the second comparator 22 with a second preselected reference level which is relatively lower than that provided at reference input terminal 16.

First consider the upper portion of receiver 8 which generates output 1. The input signal is attenuated by attenuator 32, including voltage divider resistors 36 and 38. The junction point between the resistors is connected, via line 40, to the positive input 42 of comparator 14. The attenuator enables the receiver 8 to accommodate various input signals of relatively high amplitude. A variable capacitor 34 is connected across voltage divider resistor 36 in order to match the impedance of the attenuator with the input impedance of the comparator 14. In order to compensate for the inherent offset voltage at the positive input of comparator 14, a variable resistor 44 is connected to voltage divider resistor 38 via connecting line 45.

The high level reference voltage from terminal 16 is input to a second voltage attenuator 46 including voltage divider resistors 48 and 50. In order to compensate for the offset voltage at the negative terminal 47 of comparator 14, variable resistor 54 is connected to the voltage divider resistor 50, via line 55. In order to clamp the input swing at comparator 14, diodes 56 and 58 are reverse connected between the positive input 42 of comparator 14 and respectively opposite clamping voltage potentials.

In many applications of the present receiver, the comparator is intended to perform its switching function at zero volts. Of course, in most practical situations, a normal signal-to-noise ratio for the circuitry evidences a noise signal component which must be dealt with. In order to immunize the present circuitry from such noise, a hysteresis control circuit 66 is provided as shown in FIG. 1. The circuit is in the form of a resistive attenuator circuit having variable resistor 64 and fixed resistor 62. The hysteresis voltage $V_H$, after undergoing attenuation, presents a DC voltage to input terminals 69 of comparators 14 and 22 by a connecting line 67. The effect of the hysteresis control is seen in FIG. 3A wherein a triangular input signal to the terminal 10 is illustrated. Rather than effecting the switching of comparator 14 at the zero crossover points indicated, the hysteresis control will displace the switching points to C and D, the level of these points being chosen to avoid switching due to the amplitude of a normal noise component. As a result, the output, for example on output line 20, is the pulse 21' shown in FIG. 3B.

The remaining circuitry shown in FIG. 1, dealing with the lower half of receiver 8, is similar to that just described. Thus, an attenuator 68 is provided for the positive input of comparator 22. Attenuator 68 is similar to attenuator 32 and includes voltage dividing resistors 72 and 74. The capacitor 70 is adjustable and serves the same impedance-matching function as capacitor 34 in attenuator 32. Offset compensation for the positive input 80 of comparator 22 is achieved by variable resistor 78 connected to voltage divider resistor 74. Voltage clamping diodes 96 and 98 operate in the same fashion as previously described in connection with diodes 56 and 58.

A second reference voltage is provided to the receiver at input terminal 30 and this reference voltage undergoes attenuation at attenuator 82 having voltage divider resistors 86, 88 which is contructed identically to the attenuator 46 and which attenuates the reference signal prior to its introduction to the negative input 84 of comparator 22. As in the case of variable resistor 54, the variable resistor 92 is serially connected in line 94 to compensate for the offset voltage at the negative terminal of comparator 22.

With the receiver 8 in normal operation, complementary digital signals will occur at output 1, while a second set of complementary signals having a different pulse width will occur at output 2.

In typical utilization of the present invention, in a high-speed mode, a ±10 volt input signal is accepted at terminal 10; and the hysteresis control will ensure comparator switching within ±50 mv of the referenced signals inputted at terminals 16 and 30. In a low-speed mode, the present invention will accept a ±30 volts input signal at terminal 10; and comparator switching will occur within ±100 mv of the referenced signals inputted at reference terminals 16 and 30. Thus, by adjusting the reference levels at terminals 16 and 30, two sets of complementary digital pulses may be obtained at output 1 and output 2, with each set having different pulse widths.

It should be understood that the invention is not limited to the exact details of construction shown and described herein for obvious modifications will occur to persons skilled in the art.

I claim:

1. In a digital receiver capable of multi-mode operation and having at least first and second comparators with each having a first input connected to an input signal, the improvement comprising:
   at least two signal attenuators each respectively connected between the signal input and a respective comparator first input for permitting the receiver to handle input signals of relatively high amplitude;
   a first reference signal terminal connected to a second input of the first comparator for supplying a first reference signal thereto for switching the comparator at first preselected points of the input signal and generating pulse outputs thereat having a first pulse width;
   a second reference signal terminal connected to a second input of the second comparator for supplying a second reference signal thereto for switching the comparator at second preselected points of the input signal which may be different than the first points, such switching causing the generation of pulse outputs thereat having a second pulse width;
   means connected to each of the comparators for clamping the voltage of the signals input into the comparator; and
   hysteresis control means connected to each comparator for adjusting the switching points of the comparators thereby avoiding erroneous switching due to noise.

2. The structure set forth in claim 1 together with attenuator means connected between each of the reference signal terminals and respective comparators for permitting the receiver to handle reference signals of a relatively high amplitude.

3. The structure set forth in claim 2 together with means connected to each signal attenuator for adjusting the inherent offset voltage of a respective comparator.

4. The structure set forth in claim 1 together with means connected to each signal attenuator for matching the input impedance of a respective comparator.

5. In a digital receiver capable of multi-mode operation and having at least first and second comparators with each having a first input connected to an input signal, the improvement comprising:
   at least two signal attenuators each respectively connected between the signal input and a respective comparator first input for permitting the receiver to handle input signals of relatively high amplitude;
   a first reference signal terminal connected to a second input of the first comparator for supplying a first reference signal thereto for switching the comparator at first preselected points of an input signal and generating pulse outputs thereat having a first pulse width;
   a second reference signal terminal connected to a second input of the second comparator for supplying a second reference signal thereto for switching the comparator at second preselected points of the input signal which may be different than the first points, such switching causing the generation of pulse outputs thereat having a second pulse width;
   hysteresis control means connected to each comparator for adjusting the switching points of the comparators thereby avoiding erroneous switching due to noise; and
   means connected to each signal attenuator for adjusting the inherent offset voltage of a respective comparator.

6. The structure set forth in claim 5 together with attenuator means connected between each of the reference signal terminals and respective comparators for permitting the receiver to handle reference signals of relatively high amplitude.

7. The structure set forth in claim 6 together with means connected to each signal attenuator for matching the input impedance of a respective comparator.

8. The structure set forth in claim 7 wherein each comparator outputs complementary output signals.

9. The structure set forth in claim 8 together with means connected to each of the comparators for clamping the inputs of the comparators to a preselected clamping voltage thereby ensuring that the comparators will not be exposed to excessively high voltage levels.

* * * * *

UNITED STATES PATENT AND TRADEMARK OFFICE
CERTIFICATE OF CORRECTION

PATENT NO. : 4,745,365
DATED : May 17, 1988
INVENTOR(S) : Michael Ugenti

It is certified that error appears in the above-identified patent and that said Letters Patent is hereby corrected as shown below:

Column 3, line 17, change "contructed" to

--constructed--.

Signed and Sealed this

First Day of November, 1988

*Attest:*

DONALD J. QUIGG

*Attesting Officer*     *Commissioner of Patents and Trademarks*